United States Patent
Jessie (10) Patent No.: US 7,460,001 B2
(45) Date of Patent: Dec. 2, 2008

(54) VARIABLE INDUCTOR FOR INTEGRATED CIRCUIT AND PRINTED CIRCUIT BOARD

(75) Inventor: Darryl Jessie, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 10/672,904

(22) Filed: Sep. 25, 2003

(65) Prior Publication Data

US 2005/0068146 A1 Mar. 31, 2005

(51) Int. Cl.
*H01F 5/00* (2006.01)
(52) U.S. Cl. .................................... 336/200
(58) Field of Classification Search .............. 336/65, 336/83, 200, 232; 333/172–180; 331/107 R, 331/108 R, 117 R; 257/531
See application file for complete search history.

(56) References Cited

U.S. PATENT DOCUMENTS

| | | | | |
|---|---|---|---|---|
| 4,816,784 | A * | 3/1989 | Rabjohn | 333/24 R |
| 5,461,353 | A | 10/1995 | Eberhardt | 333/246 |
| 5,483,207 | A | 1/1996 | Gabara | 331/117 |
| 5,872,489 | A * | 2/1999 | Chang et al. | 331/179 |
| 5,912,596 | A * | 6/1999 | Ghoshal | 331/117 R |
| 5,952,893 | A * | 9/1999 | Ghoshal | 331/108 C |
| 6,388,636 | B1 * | 5/2002 | Brown et al. | 343/866 |
| 6,549,077 | B1 | 4/2003 | Jou | 330/307 |
| 6,885,275 | B1 * | 4/2005 | Chang | 336/200 |
| 2002/0158711 | A1 | 10/2002 | Groves et al. | 333/174 |
| 2003/0030497 | A1 | 2/2003 | Duncan et al. | 331/34 |

FOREIGN PATENT DOCUMENTS

JP 08162331 6/1996

* cited by examiner

*Primary Examiner*—Tuyen T. Nguyen
(74) *Attorney, Agent, or Firm*—George C. Pappas; Jonathan T. Velasco; Thomas R. Rouse (57) ABSTRACT

A variable inductor can be formed on an integrated circuit with a primary conductor, a secondary conductor, and a switch. The primary conductor implements an inductor and may be formed in various patterns (e.g., a spiral). The secondary conductor forms a loop in proximity to (e.g., on the outside of) the primary conductor. The switch couples in series with the secondary conductor and opens or closes the loop. The inductance of the inductor is varied by closing and opening the loop with the switch. A current source may also be coupled in series with the secondary conductor and used to control the current flow in the secondary conductor to either increase or decrease the inductance. Multiple loops may be formed to change the inductance in more than two discrete steps. The variable inductor may be used for various applications such as filters, VCOs, and impedance matching networks.

36 Claims, 11 Drawing Sheets

VARIABLE INDUCTOR FOR INTEGRATED CIRCUIT AND PRINTED CIRCUIT BOARD

BACKGROUND

I. Field

The present invention relates generally to circuits, and more specifically to an inductor for an integrated circuit and a printed circuit board.

II. Background

With modern advances in integrated circuit (IC) process technology, it is possible to fabricate radio frequency integrated circuits (RFICs) for numerous applications such as wireless communication, networking, computing, and so on. These RFICs may include various analog circuit blocks that were previously implemented with bulky discrete circuit components. By implementing analog circuit blocks on RFICs, various benefits such as smaller size, lower cost, and improved reliability can be realized.

Many analog circuit blocks utilize reactive components such as capacitors and inductors to achieve the designed functions. For example, filters, resonator tanks, impedance matching networks, and so on may include both capacitors and inductors to obtain the desired circuit response. For some applications, such as a tank circuit for a voltage controlled oscillator (VCO), it is necessary to vary a reactive component over a specified range of value. If adjusting capacitance is acceptable, then a variable capacitor (also referred to as a "varactor") is often used as the variable reactive component. In certain applications, it is necessary or desirable to adjust inductance instead of capacitance. For these applications, a bank of inductors (each coupled in series with a respective switch) is conventionally used to obtain different inductance values by switching on the proper inductor or combination of inductors in the bank. However, the bank of inductors occupies a large area, which translates into higher cost. Moreover, the series-coupled switch can degrade the performance of the inductor.

There is therefore a need in the art for an adjustable inductor that can be fabricated on an integrated circuit.

SUMMARY

A variable inductor that can be conveniently fabricated on an integrated circuit or a printed circuit board is described herein. The variable inductor has good RF performance and may be used for various applications such as filters, VCOs, impedance matching networks, and so on.

An embodiment provides an integrated circuit comprising a primary conductor, a secondary conductor, and a switch. The primary conductor implements an inductor and may be formed in various patterns (e.g., a spiral, a loop, and so on). The secondary conductor forms a loop in proximity to (e.g., on the outside of) the primary conductor. The switch couples in series with the secondary conductor and is operable to open or close the loop. The inductance of the inductor is varied by closing and opening the loop with the switch. A current source may also be coupled in series with the secondary conductor and the switch. This current source may be used to control the current flow in the secondary conductor to either increase or decrease the inductance. Multiple loops may also be formed to change the inductance in more than two discrete steps.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
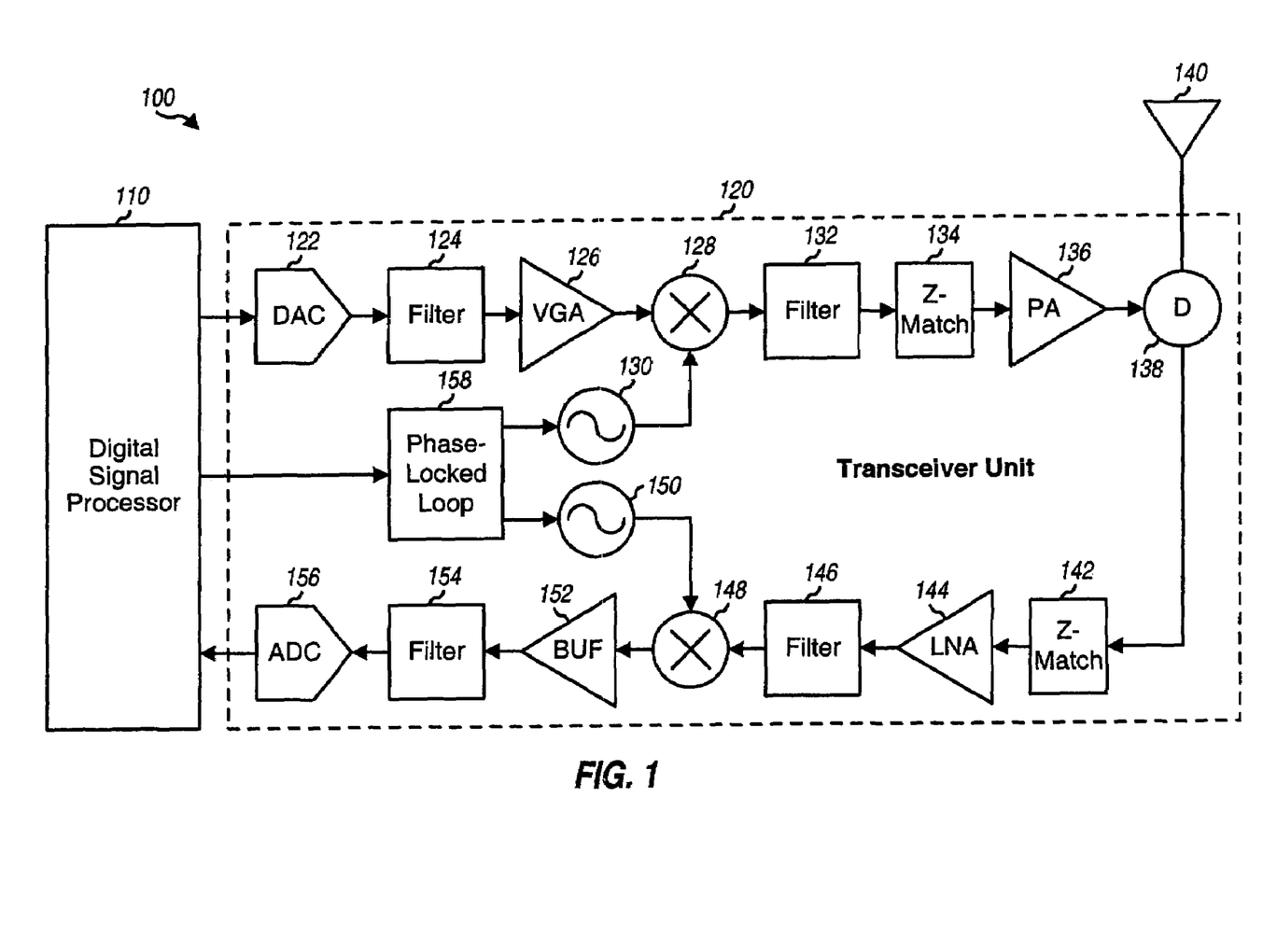
FIG. 1 shows a wireless terminal used for wireless communication.

FIG. 1 shows a block diagram of a wireless terminal 100 that may be used for wireless communication. On the transmit path, a digital signal processor (DSP) 110 processes data to be transmitted and provides a stream of chips to a transceiver unit 120. Within transceiver unit 120, one or more digital-to-analog converters (DACs) 122 convert the stream of chips to one or more analog signals. The analog signal(s) are filtered by a filter 124, amplified by a variable gain amplifier (VGA) 126, and frequency upconverted from baseband to radio frequency (RF) by a mixer 128 to generate an RF signal. The frequency upconversion is performed with an upconversion local oscillator (LO) signal from a VCO 130. The RF signal is filtered by a filter 132, amplified by a power amplifier (PA) 136, routed through a duplexer 138, and transmitted from an antenna 140. An impedance matching network (Z-match) 134 matches the input of power amplifier 136 to the output of filter 132.

On the receive path, a modulated signal is received by antenna 140, routed through duplexer (D) 138, amplified by a low noise amplifier (LNA) 144, filtered by a filter 146, and frequency downconverted from RF to baseband by a mixer 148 with a downconversion LO signal from a VCO 150. An impedance matching network 142 matches the input of LNA 144 to the output of duplexer 138. The downconverted signal is buffered by a buffer 152, filtered by a filter 154, and digitized by one or more analog-to-digital converters (ADCs) 156 to obtain one or more streams of samples. The sample stream(s) are provided to digital signal processor 110 for processing. A phase locked loop (PLL) 158 receives control information from digital signal processor 110 and provides controls for VCOs 130 and 150 to generate the proper upconversion and downconversion LO signals, respectively.

FIG. 1 shows a specific transceiver design. In a typical transceiver, the conditioning of a signal to be transmitted and the conditioning of a received signal may be performed by one or more stages of amplifier, filter, mixer, and so on, as is known in the art. Impedance matching networks may also be used throughout the transmit and receive signal paths (only two impedance matching networks 134 and 142 are shown in FIG. 1 for simplicity). FIG. 1 only shows some of the circuit blocks that may be used to condition a transmit signal and a received signal.

Wireless terminal 100 may be viewed as including a digital portion and an analog portion. The digital portion (e.g., DSP 110 and possibly DACs 122 and ADCs 156) may be implemented on one or more digital integrated circuits. The analog portion (e.g., the remaining portion of transceiver unit 120) may be implemented on one or more RF integrated circuits (RFICs) and/or with other discrete components.

As shown in FIG. 1, transceiver unit 120 includes various analog circuit blocks for various functions. Each analog circuit block may be implemented with circuit elements such as transistors, resistors, inductors, capacitors, and so on. Transistors, resistors, and capacitors can readily be fabricated on an RFIC. Inductors may also be fabricated on the RFIC, if possible, to obtain various benefits such as smaller size, lower cost, and greater reliability.

Variable inductance may be needed for some analog circuit blocks such as filters 124, 132, 146 and 154, impedance matching networks 134 and 142, VCOs 130 and 150, power amplifier 136, LNA 144, and so on. A variable inductor (also referred to herein as a "vaructor") can provide variable inductance and be conveniently fabricated on an RFIC, as described below.

A variable inductor can be formed with (1) a primary conductor for an inductor and (2) a secondary conductor used to carry currents for adjusting the inductance of the inductor. When the primary conductor is brought close to the secondary conductor, the inductance of the primary conductor is modified due to interaction of magnetic fields. If the currents in the primary and secondary conductors are in opposite directions, then the inductance of the primary conductor is reduced below a nominal value (i.e., the inductance value without the loop). Conversely, if the currents in the two conductors are in the same direction, then the inductance of the primary conductor is increased above the nominal value.

A variable inductor may be implemented with several configurations. In a "passive" configuration, the current in the secondary conductor is in the opposite direction as the current in the primary conductor, and only a reduction in inductance can be achieved. In an "active" configuration, the current in the secondary conductor can be controlled by a current source, and a reduction or an increase in inductance can be achieved by properly controlling the current source.

Figure 2A:
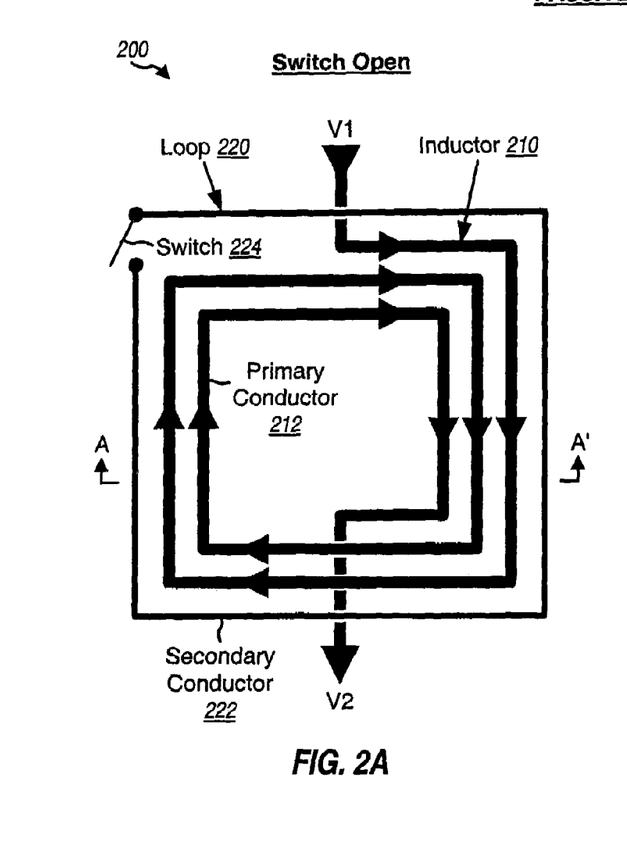
FIGS. 2A and 2B show a variable inductor in a passive configuration.
Figure 2B:
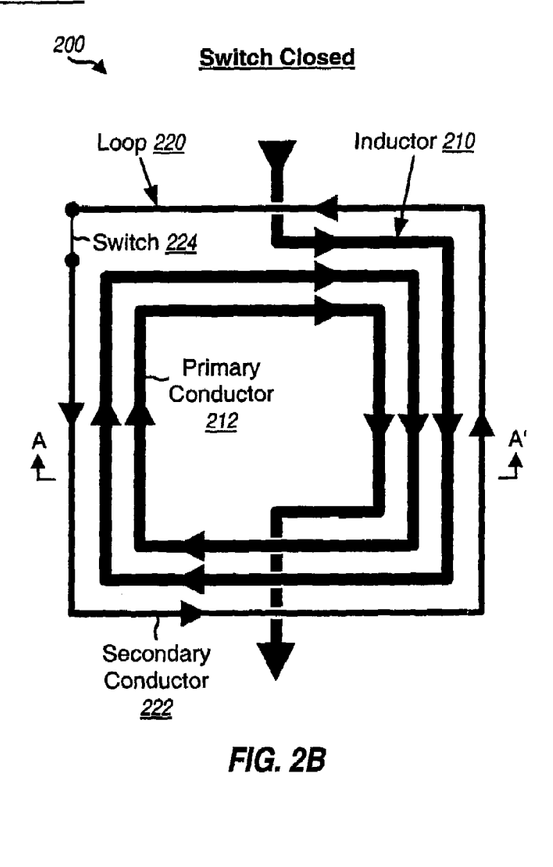

FIGS. 2A and 2B show top views of a variable inductor 200 implemented with the passive configuration. Variable inductor 200 is formed with a primary conductor 212, a secondary conductor 222, and a switch 224.

Primary conductor 212 implements a two-port inductor 210 and, for the embodiment shown in FIG. 2A, is formed in a spiral pattern. The width of primary conductor 212, the number of turns in the spiral, and the spacing between the turns may be determined by various factors such as the desired nominal inductance and quality factor (Q) for inductor 210. Primary conductor 212 may be fabricated with various types of conductive material such as (1) a low-loss metal (e.g., copper) on a metal layer, (2) a lossy metal (e.g., aluminum) relative to the low-loss metal on a layer underneath the metal layer, or (3) some other material. Higher Q may be achieved for inductor 210 if fabricated with a low-loss metal. A smaller-size inductor 210 may be fabricated on a lossy metal layer because different design rules apply.

Secondary conductor 222 forms a loop 220 that may be concentric with the spiral for primary conductor 212. Secondary conductor 222 is coupled in series with switch 224, which functions to either open or close the loop. Secondary conductor 222 may be fabricated with a conductive material that may be the same or different from the material used for primary conductor 212. For example, secondary conductor 222 may be fabricated with a low-loss metal, a lossy metal, or a conductive material (e.g., aluminum or aluminum alloy) used for interconnect between circuit components. Switch 224 may be placed anywhere on loop 220.

FIG. 2A shows an operating mode in which switch 224 is opened. In the example shown in FIG. 2A, the current in primary conductor 212 (referred to as the "primary" current) flows in a clockwise direction as indicated by the arrows. Since switch 224 is opened, no current can flow in secondary conductor 222. Hence, no image current is available to affect inductor 210. Variable inductor 200 has the nominal inductance of inductor 210.

FIG. 2B shows an operating mode in which switch 224 is closed. The current in primary conductor 212 still flows in the clockwise direction as indicated by the arrows. Since switch 224 is closed, an image current is induced in secondary conductor 222 by a changing magnetic field that is generated by the current in primary conductor 212. The image current flows in the opposite direction as the primary current and causes negative mutual coupling on primary conductor 212. This negative mutual coupling reduces the inductance of variable inductor 200 below the nominal value.

Figure 3A:
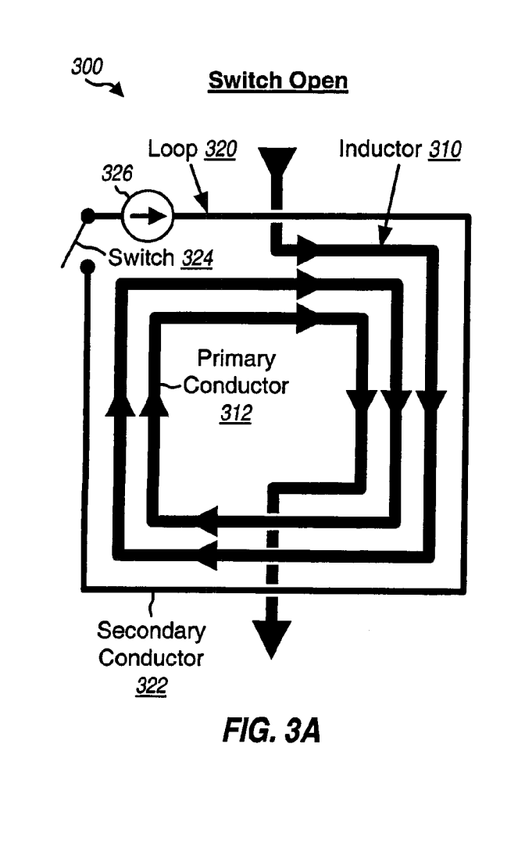
FIGS. 3A through 3C show a variable inductor in an active configuration.
Figure 3B:
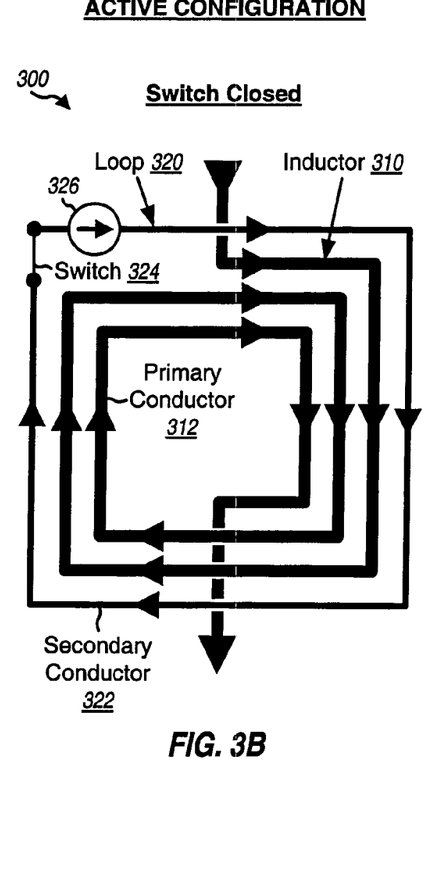
Figure 3C:
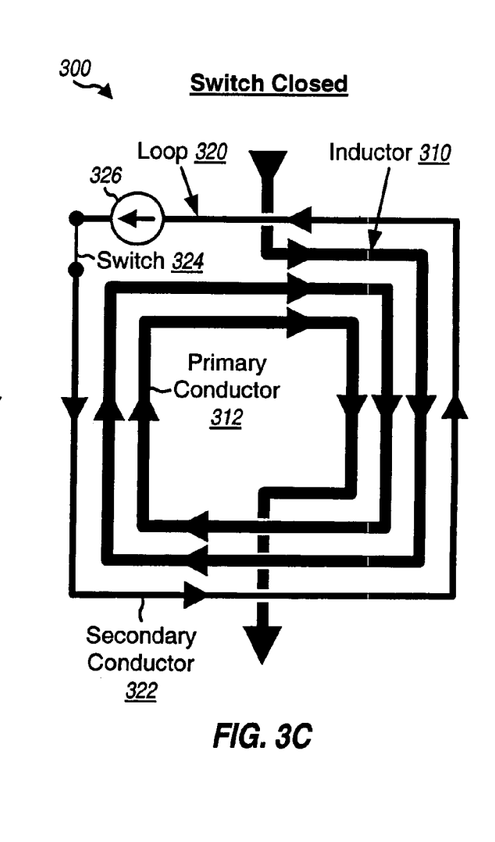

FIGS. 3A through 3C show top views of a variable inductor 300 implemented with the active configuration. Variable inductor 300 is formed with a primary conductor 312, a secondary conductor 322, a switch 324, and a current source 326. Primary conductor 312 implements a two-port inductor 310. Primary conductor 312 and secondary conductor 322 may be fabricated as described above for primary conductor 212 and secondary conductor 222, respectively, in FIGS. 2A and 2B. Secondary conductor 322, switch 324, and current source 326 couple in series and form a loop 320 and may be concentric with the spiral for primary conductor 312. Switch 324 functions to either open or close the loop.

FIG. 3A shows an operating mode in which switch 324 is opened and no current flows in secondary conductor 322. Variable inductor 300 then has the nominal inductance of inductor 310.

FIG. 3B shows an operating mode in which switch 324 is closed and a current flows in secondary conductor 322 in the same direction as the primary current. With switch 324 closed, a current can flow in secondary conductor 322. The direction of the current is determined by current source 326. In FIG. 3B, the primary current in primary conductor 312 flows in the clockwise direction as indicated by the arrows, and the current in secondary conductor 322 also flows in the clockwise direction. If the currents on primary conductor 312 and secondary conductor 322 are in the same direction, as shown in FIG. 3B, then the current causes positive mutual coupling on primary conductor 312. This positive mutual coupling increases the inductance of variable inductor 300 higher than the nominal value.

FIG. 3C shows an operating mode in which switch 324 is closed and a current flows in secondary conductor 322 in the opposite direction as the primary current. In FIG. 3C, the current in primary conductor 312 still flows in the clockwise direction. However, current source 326 forces the current in secondary conductor 322 to flow in the counterclockwise direction. The current then causes negative mutual coupling on primary conductor 312, which then reduces the inductance of variable inductor 300 below the nominal value.

Current source 326 may be implemented in various manners, as is known in the art. For both passive and active configurations, the current in the secondary conductor should operate at the same frequency as the primary current in the primary conductor. For the active configuration, this may be achieved by controlling current source 326 with a version of the signal that is passed through primary conductor 312. A control signal for current source 326 may be obtained, for example, by tapping off a portion of the signal for the primary conductor. The direction of the current flow in secondary conductor 322 may then be controlled by altering the polarity of the control signal for current source 326.

FIGS. 4A through 4D show cross-sectional views for four different placements of a secondary conductor for a variable inductor. FIGS. 4A through 4D are applicable for both the passive configuration shown in FIGS. 2A and 2B and the active configuration shown in FIGS. 3A through 3C. For clarity, the passive configuration is described below. The cross-sectional views are along line A-A' in FIG. 2A. The 2½ turns of the spiral for primary conductor 212 are represented by five filaments (shown as five shaded boxes) for the five times primary conductor 212 crosses line A-A'. Two filaments are for the left-hand side, and three filaments are for the right-hand side.

Figure 4A:
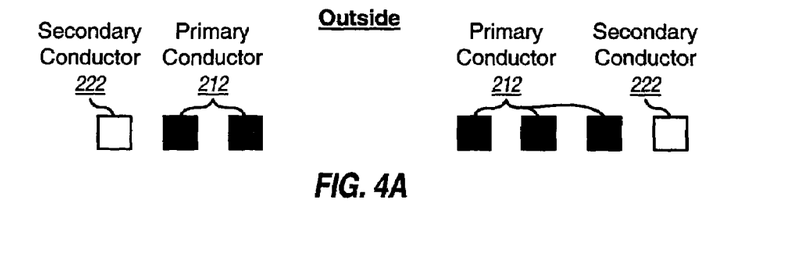
FIGS. 4A through 4D show four different placements of a secondary conductor for a variable inductor.
Figure 4B:
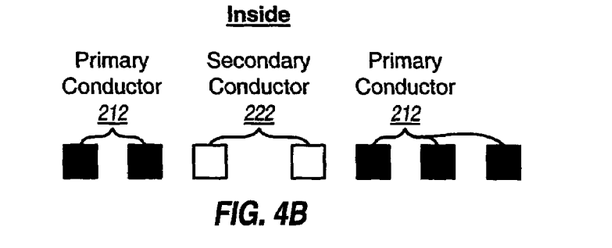
Figure 4C:
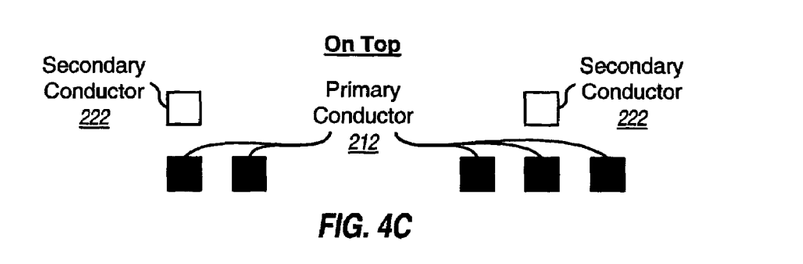
Figure 4D:
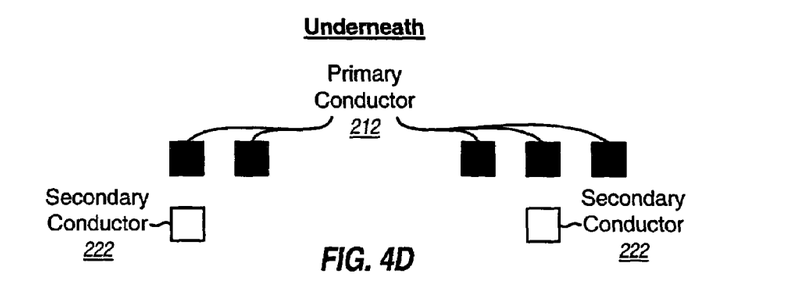

FIG. 4A shows a first embodiment in which secondary conductor 222 is located outside of the outer-most turn of the spiral for primary conductor 212. This embodiment is also shown in FIGS. 2A and 2B and FIGS. 3A through 3C. FIG. 4B shows a second embodiment in which secondary conductor 222 is located inside of the inner-most turn of the spiral for primary conductor 212. FIG. 4C shows a third embodiment in which secondary conductor 222 is located on top of the spiral for primary conductor 212. FIG. 4D shows a fourth embodiment in which secondary conductor 222 is located underneath the spiral for primary conductor 212.

The loop for secondary conductor 222 may be concentric with the spiral for primary conductor 212, as shown in FIGS. 4A through 4D. The loop for secondary conductor 222 may also be offset from (i.e., not centered with) the spiral for primary conductor 212.

For simplicity, FIGS. 2A through 4D show one loop of secondary conductor being used for the variable inductor. The loop may be closed to adjust inductance by a discrete amount. Multiple loops may also be formed with multiple secondary conductors to obtain more than two inductance values. For example, multiple concentric loops of secondary conductors may be formed outside of the spiral for the primary conductor. A loop that is closer to the primary conductor will cause a larger change in inductance, and a loop that is farther away from the primary conductor will cause a smaller change in inductance. One or more loops may be closed at any given time.

Figure 5:
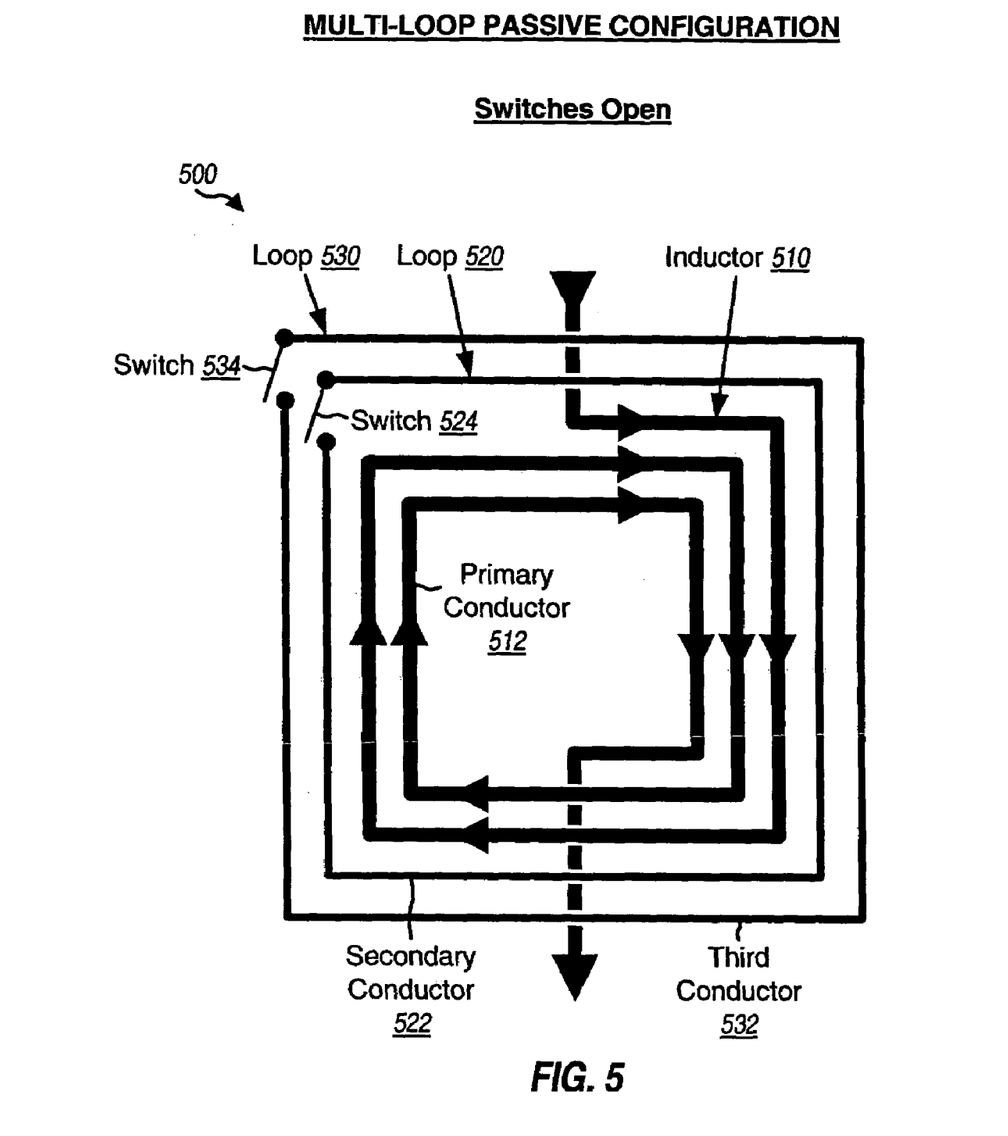
FIG. 5 show a variable inductor with two loops.

FIG. 5 shows a cross-sectional view of a variable inductor 500 with two loops. In this example, a secondary conductor 522 forms a first loop 520 that is located outside of the spiral for a primary conductor 512, which implements an inductor 510. A third conductor 532 forms a second loop 530 that is outside of the first loop 520. Secondary conductor 522 is coupled in series with a first switch 524 that opens or closes the first loop. Third conductor 532 is coupled in series with a second switch 534 that opens or closes the second loop. In general, a variable inductor may include any number of loops, and the loops may be located anywhere in proximity to the primary conductor.

FIGS. 2A through 5 show specific designs in which the primary conductor is formed in a spiral pattern and the secondary conductor is formed in a square loop that is concentric with the spiral for the primary conductor. The primary and secondary conductors may also be formed in other patterns, and this is within the scope of the invention. For example, the primary conductor may be formed in a loop-back pattern (i.e., out-and-back), a transmission line (i.e., one straight trace), a zig-zag pattern, a (e.g., square or circular) loop, a polygon, and so on. The secondary conductor may also be formed in other patterns. For example, the secondary conductor may mirror the pattern of the primary conductor. As used herein, a "loop" refers to a conduction path that can have any shape and is formed with a conductor such that the two ends of the conductor are in close proximity of one another. The loop may have one or more turns. The conductor may be composed of one or more sections on one or more layers. The conductor may also be composed of one or more types of conductive materials that may be implemented on and/or off chip and on and/or off board.

The inductor formed by the primary conductor may have two or more ports. An inductor with four or more ports is commonly referred to as a transformer. The secondary conductor may form a loop around a transformer formed by the primary conductor.

Figure 6A:
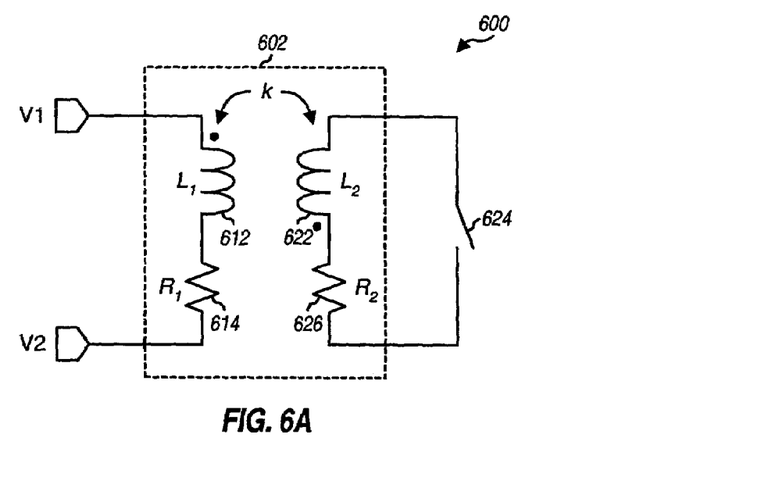
FIGS. 6A through 6C show an equivalent circuit for a variable inductor.
Figure 6B:
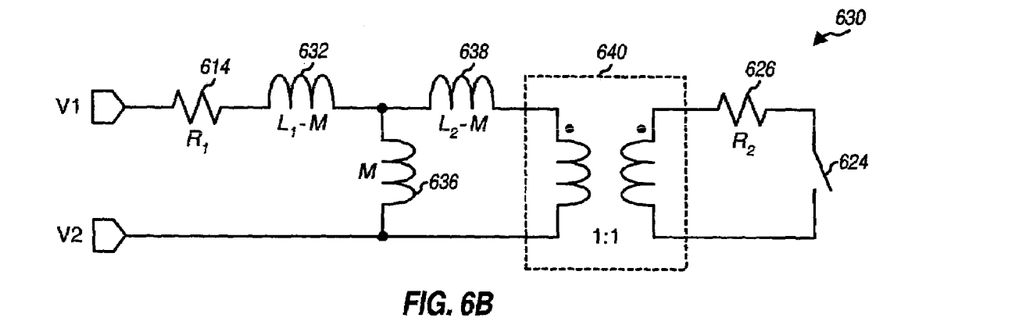
Figure 6C:
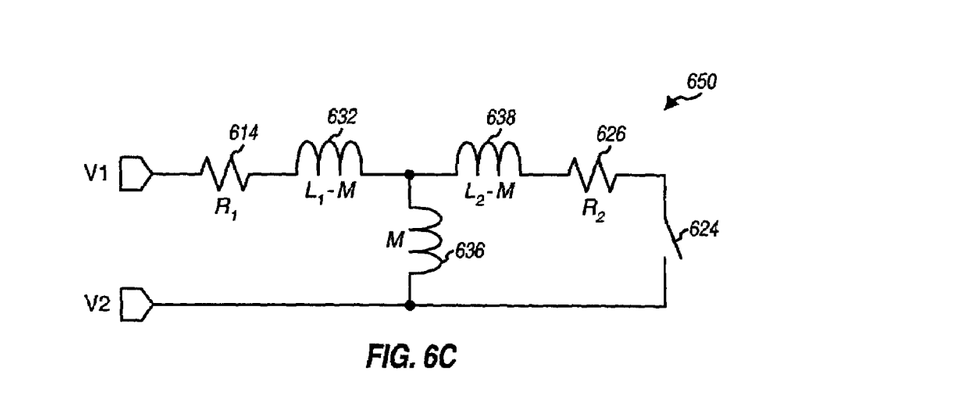

FIGS. 6A through 6C show schematic diagrams of an equivalent circuit model for a variable inductor 600 with a single loop and for the passive configuration. FIG. 6A shows the modeling of variable inductor 600 with a transformer 602 having a primary and a secondary. The primary of transformer 602 is modeled with an inductor 612 coupled in series with a resistor 614. Terminals V1 and V2 on the primary side of transformer 602 correspond to terminals V1 and V2, respectively, of variable inductor 600 (see also FIG. 2A). The secondary of transformer 600 is modeled with an inductor 622 coupled in series with a resistor 626. Resistors 614 and 626 are internal resistance of the primary and secondary conductors, respectively. A switch 624 couples in series with the secondary and either opens or closes the secondary. The primary and secondary of transformer 602 are magnetically coupled by a coupling coefficient k. The dots on opposite sides of inductors 612 and 622 indicate negative mutual coupling between the primary and secondary due to opposite current flows on the two sides.

FIG. 6B shows a transposition of variable inductor 600 with transformer 602 into a T-network 630. T-network 630 includes three inductors 632, 636 and 638 and an ideal transformer 640, all of which are coupled as shown in FIG. 6B. Resistor 614 is in the signal path between terminals V1 and V2. Switch 624 and resistor 626 couple in series with the secondary of ideal transformer 640.

FIG. 6C shows simplification of T-network 630 into an equivalent circuit 650. Since transformer 640 is ideal and has a 1:1 turns ratio between the primary and secondary (i.e., mutual coupling of one), transformer 640 can be removed from T-network 630. Switch 624 and resistor 626 can then be coupled directly to the circuit elements on the primary side of transformer 640, as shown in FIG. 6C.

The impedance between terminals V1 and V2 of variable inductor 600 may be expressed as:

$$Z = \frac{\omega^2 L_2^2 R_1 + \omega^2 M^2 R_2 + R_1 R_2^2}{\omega^2 L_2^2 + R_2^2} - j\frac{\omega^3 M^2 L_2 - \omega^3 L_1 L_2^2 - \omega L_1 R_2^2}{\omega^2 L_2^2 + R_2^2}, \quad \text{Eq (1)}$$

where $L_1$ is the inductance of the primary conductor for the inductor;

$L_2$ is the inductance of the secondary conductor for the loop;

$R_1$ is the resistance of the primary conductor;

$R_2$ is the resistance of the secondary conductor;

M is the mutual inductance, which is $M = k \cdot \sqrt{L_1 \cdot L_2}$; and $\omega$ is frequency given in units of radians/second.

Other reactive circuit elements (e.g., an inductor) may also be formed in series with the loop to obtain different electrical characteristics.

The switch to open and close a loop may be implemented in various manners. Depending on the IC technology used to fabricate the variable inductor, the switch may be implemented with an N-channel metal-oxide semiconductor (N-MOS) transistor, a P-channel MOS (P-MOS) transistor, a bipolar junction transistor (BJT), a Gallium Arsenide (GaAs) transistor, and so on.

Figure 7:
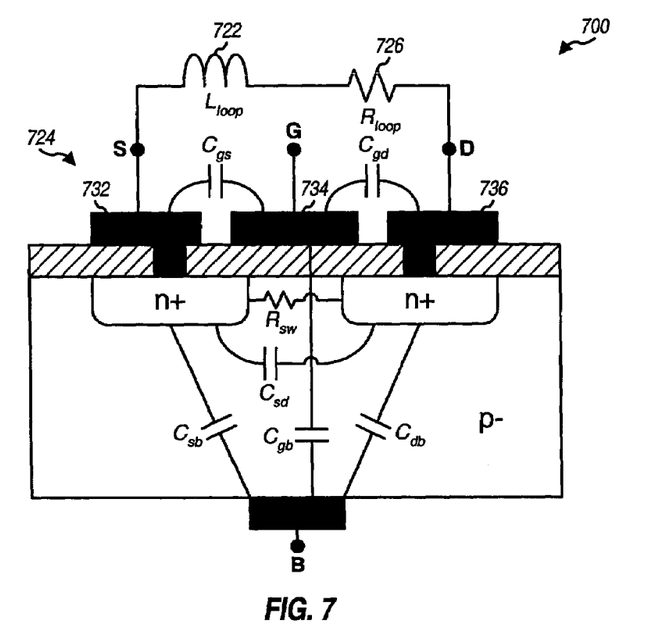
FIG. 7 shows an implementation of a switch with an N-MOS transistor.

FIG. 7 shows an implementation of a switch for a loop in a variable inductor 700 with an N-MOS transistor 724. Transistor 724 has a source 732 that couples to an inductor 722 for the secondary conductor, a drain 736 that couples to a resistor 726 for the secondary conductor, and a gate 734 that receives a control signal to open or close the loop. Inductor 722 and resistor 726 model the secondary conductor for the loop and correspond to inductor 622 and resistor 626, respectively, in FIG. 6A.

FIG. 7 also shows the modeling of various parasitics for N-MOS transistor 724. The signal path between source 732 and drain 736 is modeled with a resistor $R_{sw}$ coupled in parallel with a capacitor $C_{sd}$. The capacitance between source 732, gate 734 and drain 736 to circuit ground or substrate (B) is modeled with capacitors $C_{sb}$, $C_{gb}$ and $C_{db}$, respectively. The capacitance between source 732 and gate 734 is modeled with a capacitor $C_{gs}$, and the capacitance between gate 734 and drain 736 is modeled with a capacitor $C_{gd}$.

Figure 8:
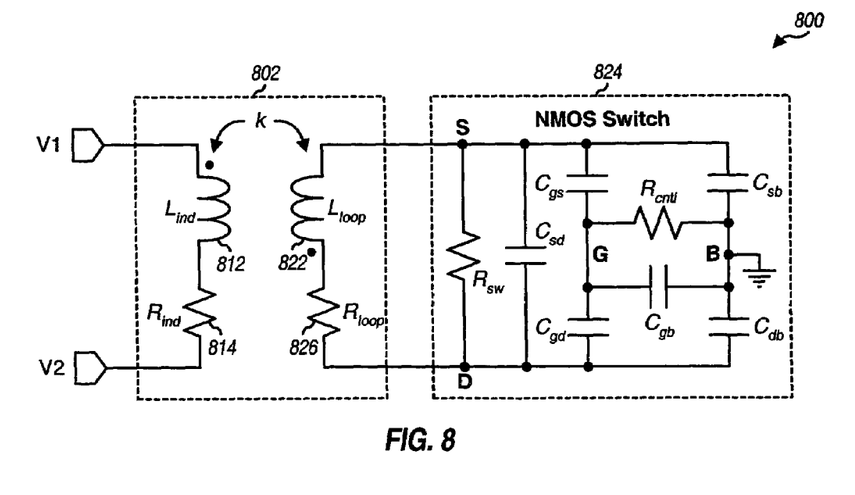
FIG. 8 shows the modeling of a variable inductor with a transformer.

FIG. 8 shows the modeling of a variable inductor 800 with a transformer 802 and a switch 824. Transformer 802 has a primary and a secondary. The primary is modeled with an inductor 812 coupled in series with a resistor 814, and the secondary is modeled with an inductor 822 coupled in series with a resistor 826. Switch 824 couples in series with the secondary of transformer 802 and includes the parasitic circuit elements shown in FIG. 7. The model shown in FIG. 8 may be used to study the effects of switch parasitics on the performance of the variable inductor, e.g., the series inductance, self resonant frequency (SRF), and so on. The impact of the switch on the performance of the variable inductor may be minimized by using a good design for the switch.

Ideally, the secondary conductor should be a perfect conductor with an infinitesimally small width and no resistance. However, in a practical implementation, the secondary conductor will have some resistance. For both the passive and active configurations, the secondary conductor affects various electrical characteristics of the variable inductor, as described below.

First, the placement of the secondary conductor determines the amount of change in the inductance of the variable inductor. If the secondary conductor is placed closer to the primary conductor, then more magnetic coupling occurs between the primary and secondary conductors, and the inductance can be changed by a larger amount. Conversely, a smaller change in inductance is obtained by placing the secondary conductor farther away from the primary conductor. The relative location of the secondary conductor to the primary conductor (e.g., concentric or offset) can also affect the inductance.

Second, the width of the secondary conductor may affect the performance of the variable inductor. A smaller width for the secondary conductor increases the series resistance of the secondary conductor, which can affect the quality factor of the variable inductor, as described below. A larger width reduces the series DC resistance but increases proximity effect (Eddy current), which is caused by changing magnetic fields in close proximity to a metal. The higher Eddy current creates another lossy coupling effect. The width of the secondary conductor can be selected based on a tradeoff of the various effects.

Third, the secondary conductor affects the quality factor (Q) of the variable inductor in several ways. The quality factor for an inductor may be expressed as:

$$Q = \frac{\omega L}{R}, \quad \text{Eq (2)}$$

where

L is the inductance of the inductor; and

R is the resistance of the inductor.

As shown in equation (2), if the inductance L of the variable inductor is reduced by the secondary conductor, then the quality factor Q is reduced proportionally, assuming that all other parameters are the same. The series resistance of the secondary conductor also impacts the quality factor. This effect is caused by a lossy path linked to the inductor operation.

Figure 9A:
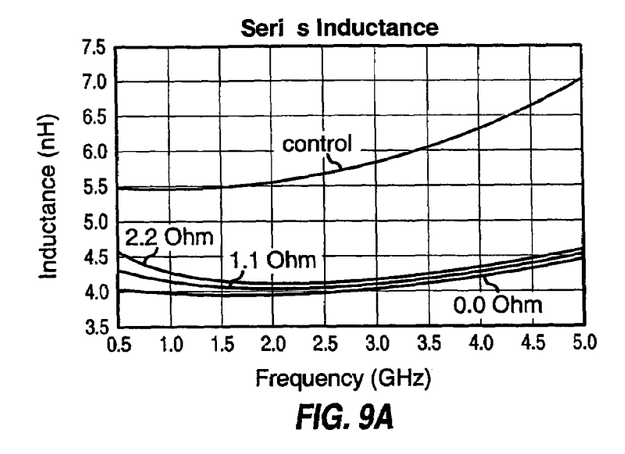
FIGS. 9A through 9C show the series inductance, series resistance, and quality factor, respectively, for an exemplary variable inductor.
Figure 9B:
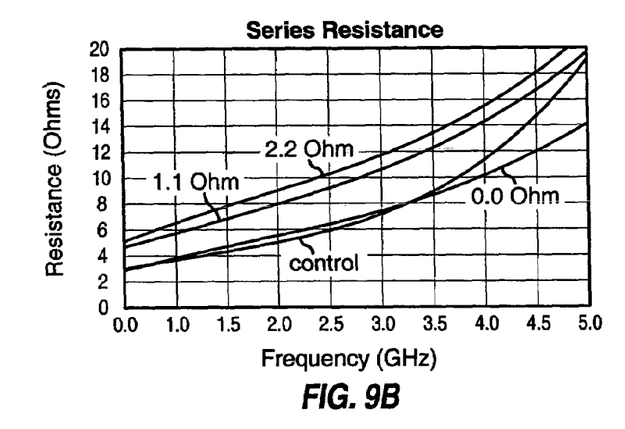
Figure 9C:
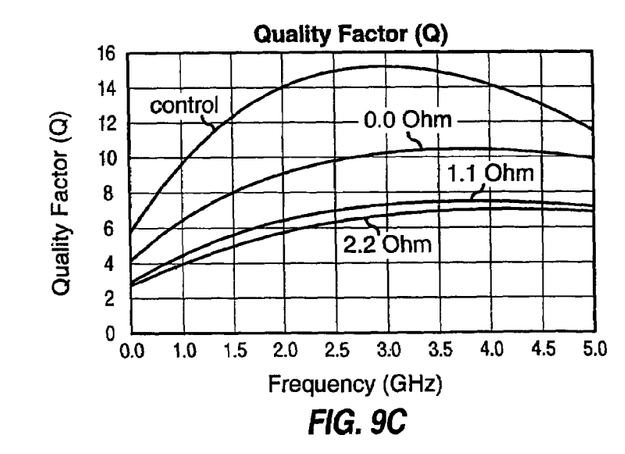

FIGS. 9A through 9C show plots of the series inductance (L), series resistance (R), and quality factor (Q), respectively, for an exemplary variable inductor implemented as shown in FIG. 2A. These plots are obtained via computer simulation. The variable inductor has a primary conductor with a nominal inductance of 5.5 nH (nano-Henry) at 2 GHz and a secondary conductor located on the outside of the primary conductor, as shown in FIGS. 2A, 2B and 4A. Simulation was performed for four different cases: (1) with the secondary conductor opened and (2) with the secondary conductor closed and having series resistance of 0, 1.1, and 2.2 Ohms. The secondary conductor is placed in the same location for all four cases.

FIG. 9A shows the inductance of the variable inductor versus frequency. The variable inductor has a nominal inductance of approximately 5.5 nH (the 'control' case). When the secondary conductor is closed, the inductance drops to approximately 4 nH. A smaller change in inductance may be obtained by moving the secondary conductor farther away from the primary conductor.

FIG. 9B shows the series resistance of the variable inductor versus frequency. The effective series resistance of the variable inductor increases with higher series resistance for the secondary conductor. The total series resistance of the variable inductor approaches $R_{ind}$ at low frequencies and is greater than $R_{ind} + R_{loop}$ at high frequencies due to skin and proximity effects, where $R_{ind}$ is the resistance of the primary conductor at DC and $R_{loop}$ is the resistance of the secondary conductor at DC. This phenomenon is more pronounced for higher k values (i.e., stronger magnetic coupling).

FIG. 9C shows the quality factor of the variable inductor versus frequency. The plots show that the quality factor of the variable inductor reduces even when the secondary conductor is simulated as a perfect conductor with a resistance of 0 Ohm. The reduction in quality factor for this case is primarily attributable to the lower inductance for the variable inductor with loop closed. A smaller degradation in quality factor occurs if the change in inductance is smaller. The quality factor reduces further as the series resistance of the secondary conductor increases.

The variable inductor described herein may be used for any circuit block in which adjustment of inductance is beneficial. For example, the variable inductor may be used for filters, tank circuits, impedance matching networks, and so on. These circuit blocks may also be part of larger circuit blocks such as VCOs, phase-locked loops (PLLs), amplifiers, mixers, and so on, as shown in FIG. 1. An exemplary VCO design with a variable inductor is described below.

Figure 10:
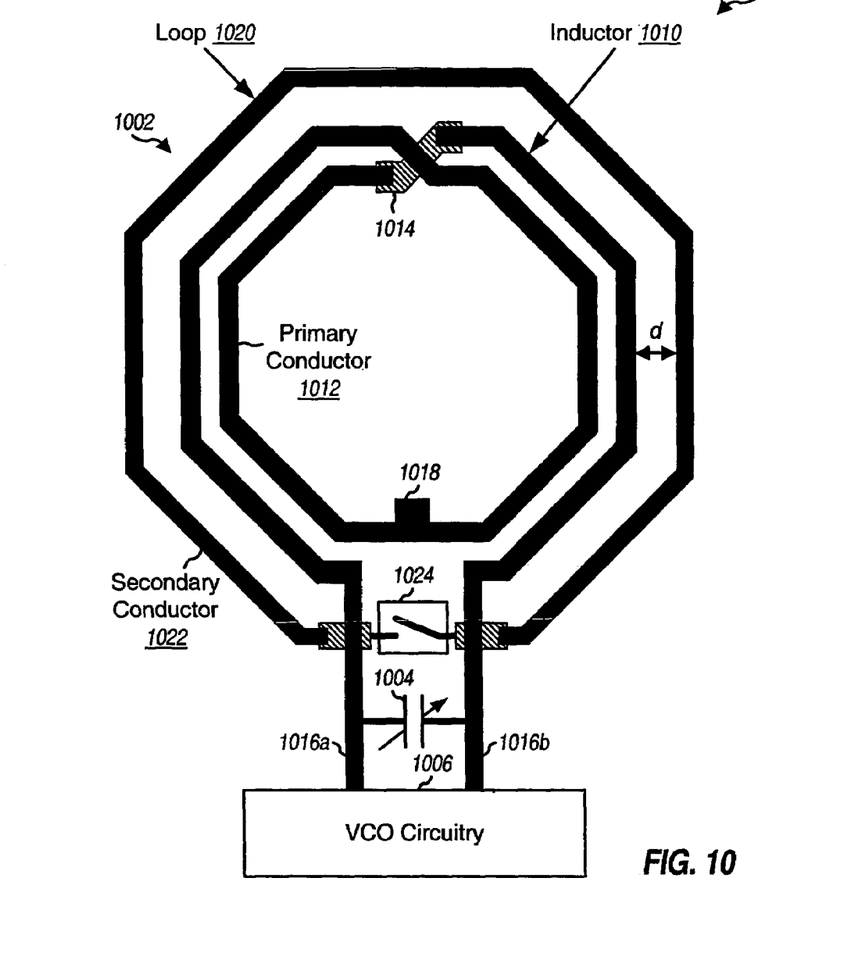
FIG. 10 shows a VCO with a variable inductor.

FIG. 10 shows an embodiment of a VCO 1000 with a variable inductor 1002, a variable capacitor (varactor) 1004, and VCO circuitry 1006. Variable inductor 1002 is formed with a primary conductor 1012, a secondary conductor 1022, and a switch 1024. Primary conductor 1012 implements a three-port inductor 1010 and is formed in a double spiral pattern. To achieve high quality factor, primary conductor 1012 is fabricated almost entirely on a low-loss metal layer (e.g., copper) except for one underpass 1014 used to interconnect the two sections of the primary conductor. Interconnects 1016a and 1016b for primary conductor 1012 form two ports of inductor 1010 and are not routed on an underlayer in order to achieve low-loss. A 'tap' pin 1018 forms the third port of inductor 1010 and is provided with a power supply voltage, which is used by circuit components coupled to primary conductor 1012.

Secondary conductor 1022 is formed on the outside of (and at a distance of d away from) the double spiral of primary conductor 1012. To attain low resistance, secondary conductor 1022 is also fabricated almost entirely on the low-loss metal layer. Secondary conductor 1022 couples in series with switch 1024 and forms a loop 1020 that is concentric with the double spiral for primary conductor 1012. Switch 1024 functions to either open or close the loop. Switch 1024 can be placed anywhere on the loop. However, since an underpass is needed to interconnect the two ends of secondary conductor 1022, switch 1024 can be conveniently fabricated on an underlayer and between the two interconnects 1016a and 1016b for primary conductor 1012, as shown in FIG. 10.

Varactor 1004 couples in parallel with variable inductor 1002 (i.e., the two ends of varactor 1004 couple to the two interconnects 1016a and 1016b for variable inductor 1002). VCO circuitry 1006 also couples to variable inductor 1002 and varactor 1004 at interconnects 1016a and 1016b. VCO circuitry 1006 may include, for example, amplifier, capacitors, delay circuit, buffer, divider circuit, and so on.

Figure 11:
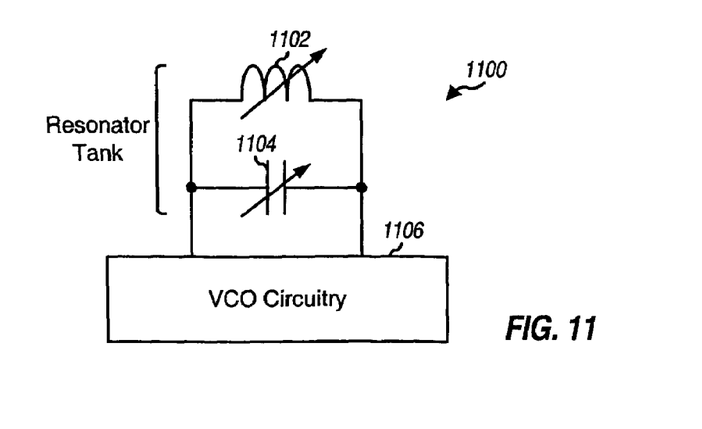
FIG. 11 shows an equivalent circuit for the VCO in FIG. 10.

FIG. 11 shows a schematic diagram of an equivalent circuit 1100 for VCO 1000. Equivalent circuit 1100 includes a variable inductor 1102, a variable capacitor 1104, and VCO circuitry 1106 that correspond to variable inductor 1002, variable capacitor 1004, and VCO circuitry 1006, respectively, in FIG. 10.

As shown in FIGS. 10 and 11, variable inductor 1002 and variable capacitor 1004 form a resonator tank for VCO 1000. The nominal inductance for the inductor and the nominal capacitance for the capacitor of a resonator tank are typically selected based on the center frequency of the resonator tank. This center frequency is in turn dependent on the frequency of the analog circuit block where the resonator tank is used.

VCO 1000 can be designed to operate at one of two specified frequencies (e.g., 3.8 GHz and 4.2 GHz) with the two states of variable inductor 1002. Primary conductor 1012 can be designed such that VCO 1000 operates at the lower of the two specified frequencies (e.g., 3.8 GHz) when switch 1024 is opened and variable inductor 1002 has a higher inductance (e.g., approximately 1.5 nH). Secondary conductor 1022 can be designed such that VCO 1000 operates at the higher of the two specified frequencies (e.g., 4.2 GHz) when switch 1024 is closed and variable inductor 1002 has a lower inductance (e.g., approximately 1.24 nH).

Variable inductor 1002 may be used to select between the two specified frequencies for VCO 1000. Varactor 1004 may be used to tune the frequency of VCO 1000 around the selected frequency. For example, VCO 1000 may be part of a phase locked loop that can adjust the capacitance of varactor 1004 so that the frequency of the VCO is locked to a reference frequency that is related to the selected frequency. The required tuning range for VCO 1000 is dependent on various factors such as, for example, the tolerance of circuit components for VCO 1000, the range of frequencies for the reference signal, and so on.

By designing VCO 1000 to cover two specified frequencies with two states of variable inductor 1002, VCO 1000 is equivalent to and can replace two VCOs operating at the two frequencies. The two specified frequencies may be for two frequency bands in a wireless communication system, two frequency bands used by two wireless systems, and so on. For example, VCO 1000 may be designed to cover 3.8 and 4.2 GHz, which are twice the frequencies for a Personal Communication System (PCS) band and an International Mobile Telecommunications-2000 (IMT-2000) band, respectively. VCO 1000 may be designed to operate at more than two frequencies by implementing variable inductor 1002 with multiple loops.

Other variations of the variable inductor may also be implemented, and this is within the scope of the invention. For example, a capacitor may be coupled in series with the switch in the loop and used to alter the impedance of the variable inductor.

Figure 12A:
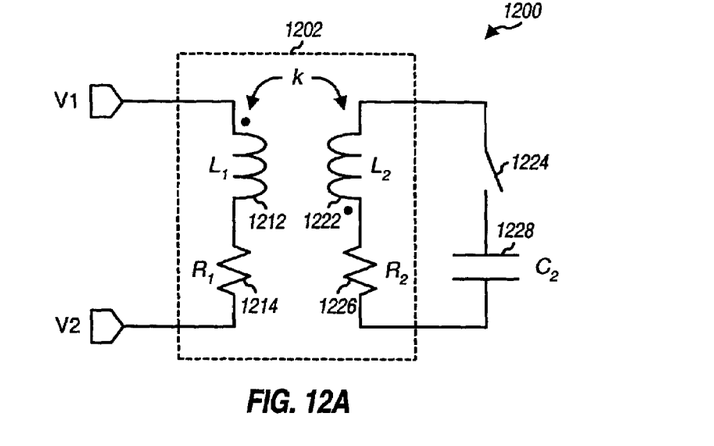
FIGS. 12A through 12C show an equivalent circuit for a variable inductor 1200 with a series capacitor in the loop.
Figure 12B:
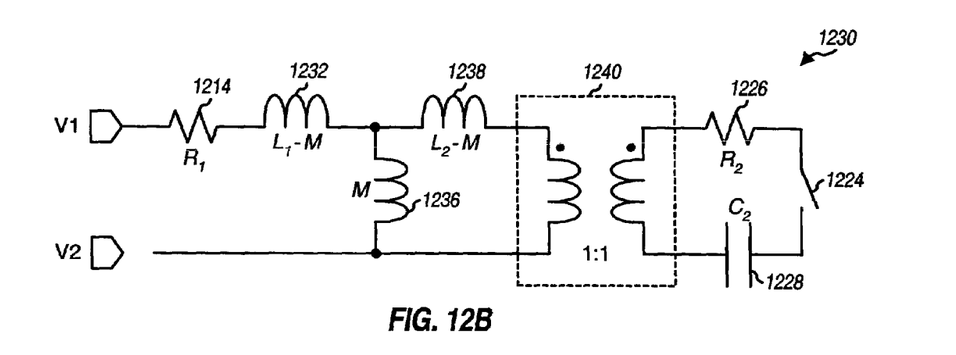
Figure 12C:
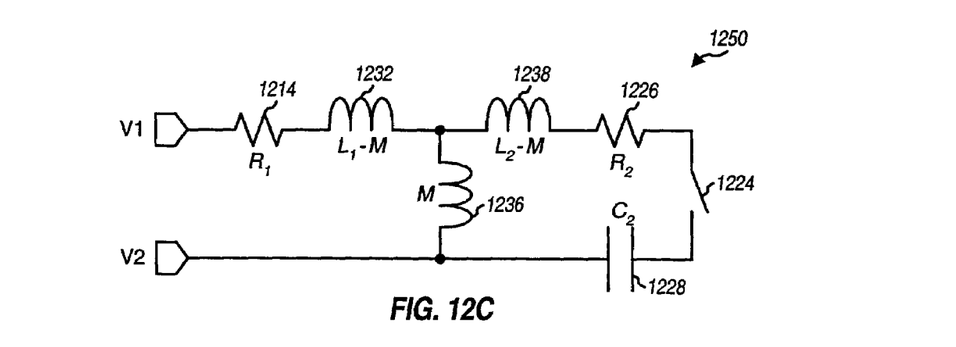

FIGS. 12A through 12C show schematic diagrams of an equivalent circuit model of a variable inductor 1200 with a single loop having a series capacitor. FIG. 12A shows the modeling of variable inductor 1200 with a transformer 1202 having (1) a primary composed of an inductor 1212 coupled in series with a resistor 1214 and (2) a secondary composed of an inductor 1222 coupled in series with a resistor 1226. Resistors 1214 and 1226 are internal resistance of the primary and secondary conductors, respectively. A switch 1224 and a capacitor 1228 couple in series with the secondary of transformer 1202.

FIG. 12B shows a transposition of variable inductor 1200 with transformer 1202 into a T-network 1230 that includes three inductors 1232, 1236 and 1238 and an ideal transformer 1240, all of which are coupled as shown in FIG. 12B. Resistor 1214 is in the signal path on the primary side of transformer 1240. Switch 1224, resistor 1226, and capacitor 1228 couple in series on the secondary side of transformer 1240.

FIG. 12C shows simplification of T-network 1230 into an equivalent circuit 1250. Ideal transformer 1240 is removed in equivalent circuit 1250. Switch 1224, resistor 1226, and capacitor 1228 are coupled directly to the circuit elements on the primary side of transformer 1240, as shown in FIG. 12C. Because capacitor 1228 and inductor 1238 couple in series, the reactance of capacitor 1228 offsets the reactance of inductor 1238. If the reactance of capacitor 1228 is sufficiently large, then the reactance of inductor 1238 can be canceled. Since the series combination of capacitor 1228 and inductor 1238 is in parallel with inductor 1236, a parallel resonant circuit is formed if the reactance of capacitor 1228 is larger than the reactance of inductor 1238. The inductance of variable inductor 1200 may be increased by the parallel resonant circuit.

A variable inductor may be used in a variety of circuit applications and can provide various advantages. First, the inductance of the variable inductor can be changed without coupling a significant amount of parasitics directly onto a circuit. A conventional method of switching an inductor in or out of a circuit with a series coupled switch can introduce a large amount of parasitics that can significantly degrade the quality factor of the inductor. Second, the variable inductor can typically be implemented with a small amount of space. Typically, circuit components are kept a small distance away from an inductor to avoid affecting the performance of the inductor. The secondary conductor can be conveniently located in the keep-out area around the inductor. If reactive tuning is achieved with a varactor, as is commonly done, then some extra space would need to be allocated in order to fabricate this varactor. With inductive tuning, this extra space generally does not need to be allocated. Third, tighter tolerance can typically be achieved for a variable inductor than a varactor. This is because changes in inductance over temperature and IC process variations for a variable inductor are typically much smaller than changes in capacitance for a varactor or a capacitor. For example, inductance changes over temperature and process variations may be less than 5% whereas capacitance changes may be up to 30%.

A variable inductor can also be advantageously used for circuit applications that require inductive tuning. For example, an impedance matching network may require inductive tuning in order to achieve the appropriate impedance match, which cannot be achieved with capacitance tuning alone. A variable inductor may also be used to reduce the amount of capactive tuning required for a circuit. A combination of inductive and capacitive tuning is used to achieve the required reactive tuning. This allows a smaller varactor to be fabricated, which occupies less area and has improved performance over a larger varactor.

Figure 13:
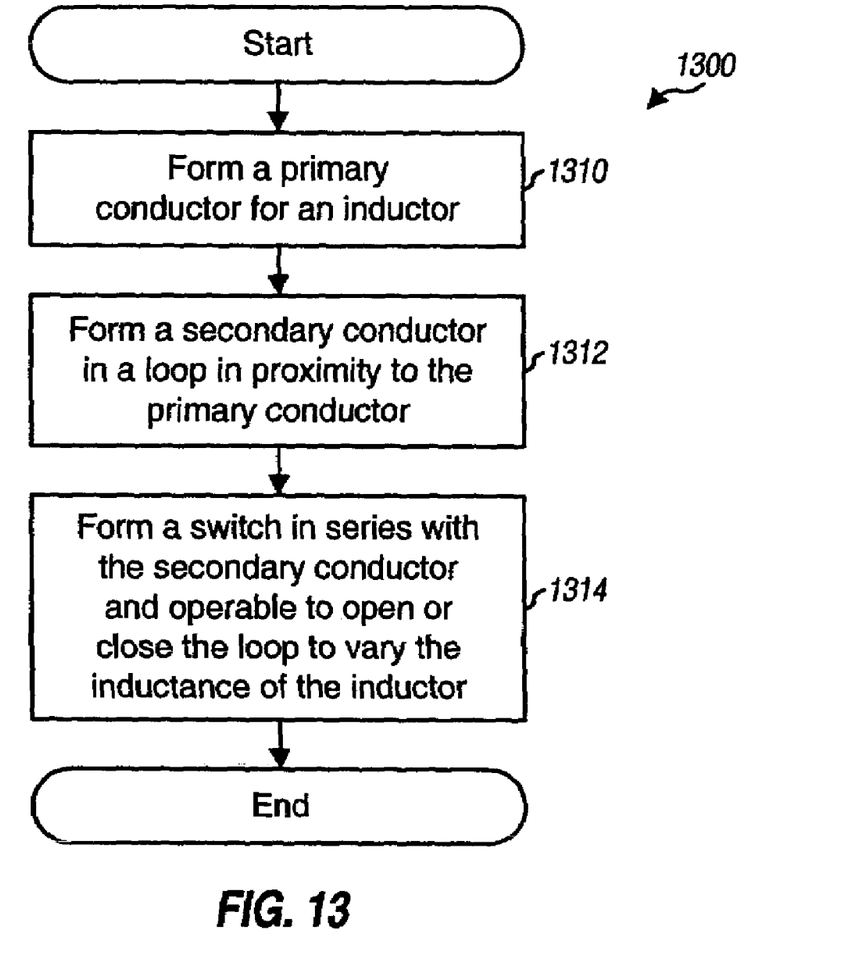
FIG. 13 shows a process for fabricating a variable inductor.

FIG. 13 shows a process 1300 for fabricating a variable inductor on an integrated circuit. A primary conductor for an inductor is formed (e.g., on a low-loss metal layer) on a substrate of the integrated circuit (step 1310). A secondary conductor is formed in a loop in proximity to the primary conductor (step 1312). A switch is formed in series with the secondary conductor and is operable to open or close the loop to vary the inductance of the inductor (step 1314). For the active implementation, a current source may be formed in series with the secondary conductor and the switch. Other circuit components may also be formed, depending on the circuit application. For example, a capacitor may be fabricated in parallel with the primary conductor to form a resonator tank.

The techniques described herein to fabricate a variable inductor in an integrated circuit may also be used to form a variable inductor at the board level. A circuit element (e.g., an inductor, a transmission line, or some other circuit element) may be formed with a primary conductor on a printed circuit board. A secondary conductor may also be formed on the circuit board, for example, in the manner as that described above. The primary and secondary conductors may be formed with traces on the circuit board. A switch opens or closes the loop for the secondary conductor, which then varies the electrical characteristics (e.g., the inductance) of the circuit element formed by the primary conductor.

The variable inductor described herein may be used for various types of IC such as an RFIC, a application specific integrated circuit (ASIC), a digital signal processor (DSP), and so on. The variable inductor may also be fabricated with various IC process technologies such as complementary MOS (CMOS), NMOS, BJT, bipolar-CMOS (BiCMOS), silicon germanium (SiGe), gallium arsenide (GaAs), and so on. ICs with variable inductors may be used for various systems and applications such as communication, networking, computing, and so on. For example, these ICs may be used in wireless communication systems such as a Code Division Multiple Access (CDMA) system, a Wideband-CDMA (W-CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit (IC) comprising:
a primary conductor for an inductor;
a secondary conductor forming a loop in proximity to the primary conductor;
a switch coupled in series with the secondary conductor and operable to open or close the loop, wherein inductance of the inductor is varied by closing and opening the loop with the switch; and
a current source coupled in series with the secondary conductor and the switch, the current source being operable to control a current in the secondary conductor to flow in a first direction in the secondary conductor to reduce the inductance of the inductor and in a second direction in the secondary conductor to increase the inductance.

2. The integrated circuit of claim 1, wherein the primary conductor is formed in a spiral pattern.

3. The integrated circuit of claim 1, wherein the secondary conductor is located outside of the primary conductor.

4. The integrated circuit of claim 1, wherein the secondary conductor is located inside of the primary conductor.

5. The integrated circuit of claim 1, wherein the secondary conductor is located on a layer on top of the primary conductor.

6. The integrated circuit of claim 1, wherein the secondary conductor is located on a layer underneath the primary conductor.

7. The integrated circuit of claim 1, further comprising: a third conductor forming a second loop in proximity to the primary conductor; and a second switch coupled in series with the third conductor and operable to open or close the second loop.

8. The integrated circuit of claim 1, further comprising: a capacitor coupled in series with the secondary conductor and the switch.

9. The integrated circuit of claim 1, further comprising: a reactive circuit element coupled in series with the secondary conductor and the switch.

10. The integrated circuit of claim 1, wherein the primary conductor is fabricated with a low-loss metal.

11. The integrated circuit of claim 1, wherein the secondary conductor is fabricated with a low-loss metal.

12. The integrated circuit of claim 1, wherein the switch is implemented with a metal-oxide semiconductor (MOS) transistor.

13. The integrated circuit of claim 1, wherein the secondary conductor is placed at a predetermined distance away from the primary conductor, the predetermined distance being selected based on a particular amount of change in inductance with the loop opened and closed.

14. The integrated circuit of claim 1, further comprising: a capacitor coupled to two ends of the primary conductor, wherein the capacitor and the inductor form a resonator tank.

15. The integrated circuit of claim 1, wherein the inductor is part of a voltage controlled oscillator (VCO).

16. The integrated circuit of claim 1, wherein the inductor is part of a filter.

17. The integrated circuit of claim 1, wherein the inductor is part of an impedance matching network.

18. An integrated circuit (IC) comprising:
a primary conductor for an inductor, the primary conductor being formed with traces on a circuit board;
a secondary conductor forming a loop with traces on the circuit board and in proximity to the primary conductor;
a switch coupled in series with the secondary conductor and operable to open or close the loop, wherein inductance of the inductor is varied by closing and opening the loop with the switch;
a current source coupled in series with the secondary conductor and the switch, the current source being operable to control a current in the secondary conductor to flow in a first direction in the secondary conductor to reduce the inductance of the inductor and in a second direction in the secondary conductor to increase the inductance; and
a capacitor coupled to two ends of the primary conductor, wherein the capacitor and inductor form a resonator tank for a voltage controlled oscillator (VCO), and wherein the VCO is operable at two frequencies corresponding to the loop being closed and opened.

19. The integrated circuit of claim 18, wherein the capacitor is a variable capacitor.

20. An integrated circuit (IC) comprising:
a primary conductor for an inductor;
a secondary conductor forming a loop in proximity to the primary conductor;
switching means, coupled in series with the secondary conductor, the switching means operable to open or close the loop, wherein inductance of the inductor is varied by closing and opening to loop; and
current control means, coupled in series with the secondary conductor and the switching means, for controlling a current in the secondary conductor to flow in a first direction in the secondary conductor to reduce the inductance of the inductor and in a second direction in the secondary conductor to increase the inductance.

21. The integrated circuit of claim 20, wherein the primary conductor is formed in a spiral pattern.

22. The integrated circuit of claim 20, wherein the secondary conductor is located outside of the primary conductor.

23. The integrated circuit of claim 20, wherein the secondary conductor is located inside of the primary conductor.

24. The integrated circuit of claim 20, wherein the secondary conductor is located on a layer on top of the primary conductor.

25. The integrated circuit of claim 20, wherein the secondary conductor is located on a layer underneath the primary conductor.

26. The integrated circuit of claim 20, further comprising: a third conductor forming a second loop in proximity to the primary conductor; and a second switch coupled in series with the third conductor and operable to open or close the second loop.

27. The integrated circuit of claim 20, further comprising: a capacitor coupled in series with the secondary conductor and the switching means.

28. The integrated circuit of claim 20, further comprising: a reactive circuit element coupled in series with the secondary conductor and the switching means.

29. The integrated circuit of claim 20, wherein the primary conductor is fabricated with a low-loss metal.

30. The integrated circuit of claim 20, wherein the secondary conductor is fabricated with a low-loss metal.

31. The integrated circuit of claim 20, wherein the switching means comprises with a metal-oxide semiconductor (MOS) transistor.

32. The integrated circuit of claim 20, wherein the secondary conductor is placed at a predetermined distance away from the primary conductor, the predetermined distance being selected based on a particular amount of change in inductance with the loop opened and closed.

33. The integrated circuit of claim 20, further comprising: a capacitor coupled to two ends of the primary conductor, wherein the capacitor and the inductor form a resonator tank.

34. The integrated circuit of claim 20, wherein the inductor is part of a voltage controlled oscillator (VCO).

35. The integrated circuit of claim 20, wherein the inductor is part of a filter.

36. The integrated circuit of claim 20, wherein the inductor is part of an impedance matching network.

* * * * *